US012772543B2

(12) United States Patent
Hook et al.

(10) Patent No.: US 12,772,543 B2

(45) Date of Patent: Oct. 20, 2026

(54) STACKED DEVICES CONTAINING AT LEAST ONE LATERAL DIODE

(71) Applicant: International Business Machines Corporation, Armonk, NY (US)

(72) Inventors: Terence Hook, Jericho Center, VT (US); Junli Wang, Slingerlands, NY (US); Chen Zhang, Santa Clara, CA (US); Anthony I. Chou, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 518 days.

(21) Appl. No.: 18/195,677

(22) Filed: May 10, 2023

(65) Prior Publication Data

US 2024/0379657 A1 Nov. 14, 2024

(51) Int. Cl.

| | |
|---|---|
| ***H10D 84/80*** | (2025.01) |
| ***H10D 8/00*** | (2025.01) |
| ***H10D 30/43*** | (2025.01) |
| ***H10D 30/67*** | (2025.01) |
| ***H10D 62/10*** | (2025.01) |

(52) U.S. Cl.

CPC ........... *H10D 84/811* (2025.01); *H10D 8/411* (2025.01); *H10D 30/43* (2025.01); *H10D 30/6735* (2025.01); *H10D 62/121* (2025.01)

(58) Field of Classification Search

None

See application file for complete search history.

(56) References Cited

U.S. PATENT DOCUMENTS

| | | | | |
|---|---|---|---|---|
| 7,863,112 | B2 | 1/2011 | Nair et al. | |
| 7,888,775 | B2 | 2/2011 | Russ et al. | |
| 9,006,087 | B2 | 4/2015 | Chang et al. | |
| 9,058,992 | B2 | 6/2015 | Cheng et al. | |
| 9,431,388 | B1 | 8/2016 | Gauthier, Jr. et al. | |
| 9,842,835 | B1 * | 12/2017 | Cheng | H10D 30/6744 |
| 9,847,391 | B1 * | 12/2017 | Zang | H10D 62/121 |
| 9,991,359 | B1 | 6/2018 | Balakrishnan et al. | |
| 10,504,890 | B2 | 12/2019 | Cheng et al. | |
| 10,692,768 | B1 * | 6/2020 | Rubin | H10D 64/017 |
| 11,075,273 | B1 | 7/2021 | Reznicek et al. | |
| 11,101,374 | B1 | 8/2021 | Reznicek et al. | |
| 2019/0181224 | A1 * | 6/2019 | Zhang | H10D 62/121 |
| 2019/0221638 | A1 * | 7/2019 | Reznicek | H10D 62/114 |
| 2020/0044023 | A1 * | 2/2020 | Reznicek | H10D 62/121 |
| 2022/0415925 | A1 * | 12/2022 | Thomson | H10D 89/611 |
| 2024/0379658 | A1 | 11/2024 | Hook et al. | |

OTHER PUBLICATIONS

Stewart, M., et al., "High performance gated lateral polysilicon PIN diodes", Solid-State Electronics 44, May 2000, pp. 1613-1619.

List of IBM Patents or Patent Applications Treated as Related, dated May 10, 2023, 2 pages.

* cited by examiner

*Primary Examiner* — Bilkis Jahan

(74) *Attorney, Agent, or Firm* — Scully, Scott, Murphy & Presser, P.C.; Samuel Waldbaum

(57) ABSTRACT

A semiconductor structure is provided including stacked first and second devices wherein at least one of the stacked devices includes a lateral diode. The lateral diode includes a p-doped region as an anode, an n-doped region as a cathode and a semiconductor channel material region sandwiched between the anode and the cathode.

20 Claims, 1 Drawing Sheet

STACKED DEVICES CONTAINING AT LEAST ONE LATERAL DIODE

CROSS REFERENCE TO RELATED APPLICATION

The present application is related to U.S. application Ser. No. 18/195,701, filed concurrently on the same date as the present application, the entire content of this related application is incorporated herein by reference.

BACKGROUND

The present application relates to semiconductor technology, and more particularly to a semiconductor structure including stacked first and second devices wherein at least one of the stacked devices includes a lateral diode.

Stacking of field effect transistors (FETs) is an attractive architecture for future complementary metal oxide semiconductor (CMOS) scaling, and potentially for ultimately scaled technology. By directly stacking FETs one over the other (for example, pFETs over nFETs, nFETs over pFETs, pFETs over pFETs, or nFETs over nFETs) significant area scaling can be achieved.

In stacked device technology, some of the conventional "passive" devices, i.e., non-transistors, will have to be modified. One such passive device is a diode. A diode is two terminal electronic component that conducts current primarily in one direction (asymmetric conductance). A diode has low (ideally zero) resistance in one direction and high (ideally infinite) resistance in the other direction. Semiconductor diodes are a type of diode that includes a crystalline semiconductor material with a p-n junction connected to two terminals. There is a need to provide a diode that can be implemented in stacked technology.

SUMMARY

A semiconductor structure is provided including stacked first and second devices wherein at least one of the stacked devices includes a lateral diode. The lateral diode includes a p-doped region as an anode, an n-doped region as a cathode and a semiconductor channel material region sandwiched between the anode and the cathode.

In one aspect of the present application, a semiconductor structure is provided. In one embodiment of the present application, the semiconductor structure includes a first device including a first pair of doped regions separated by a first semiconductor channel material region, and a second device located above the first device and including a second pair of doped regions separated by a second semiconductor channel material region. In the present application, the first pair of doped regions are coplanar with each other and the second pair of doped regions are coplanar with each other, and at least one of the first pair of doped regions and the second pair of doped regions includes an n-doped region and a p-doped region. In the present application, the p-doped region functions as an anode of a lateral diode, and the n-doped region functions as a cathode of the lateral diode. The stacked first and second devices are located in a diode region of a semiconductor substrate.

Embodiments include the first pair of doped regions as the n-doped region and the p-doped region of the lateral diode, and the second pair of doped regions are source/drain regions of a transistor; the second pair of doped regions as the n-doped region and the p-doped region of the lateral diode and the first pair of doped regions are source/drain regions of a transistor; and the first pair of doped regions as the n-doped region and the p-doped region of a first lateral diode and the second pair of doped regions as the n-doped region and the p-doped region of a second lateral diode.

In some embodiments of the present application, the semiconductor structure further includes a stacked FET located in a stacked FET device region of the semiconductor substrate; the stacked FET device region is located adjacent to the diode region including the first and second stacked devices. The stacked FET device includes an upper FET stacked above a lower FET. Embodiments include that the lower FET and the upper FET are of a same conductivity type (i.e., both are nFETs or both are pFET), or the lower FET is of different conductivity type than the upper FET (i.e., the lower FET is a pFET and the upper FET is an nFET, or the lower FET is an nFET and the upper FET is a pFET).

DETAILED DESCRIPTION

Figure 1:
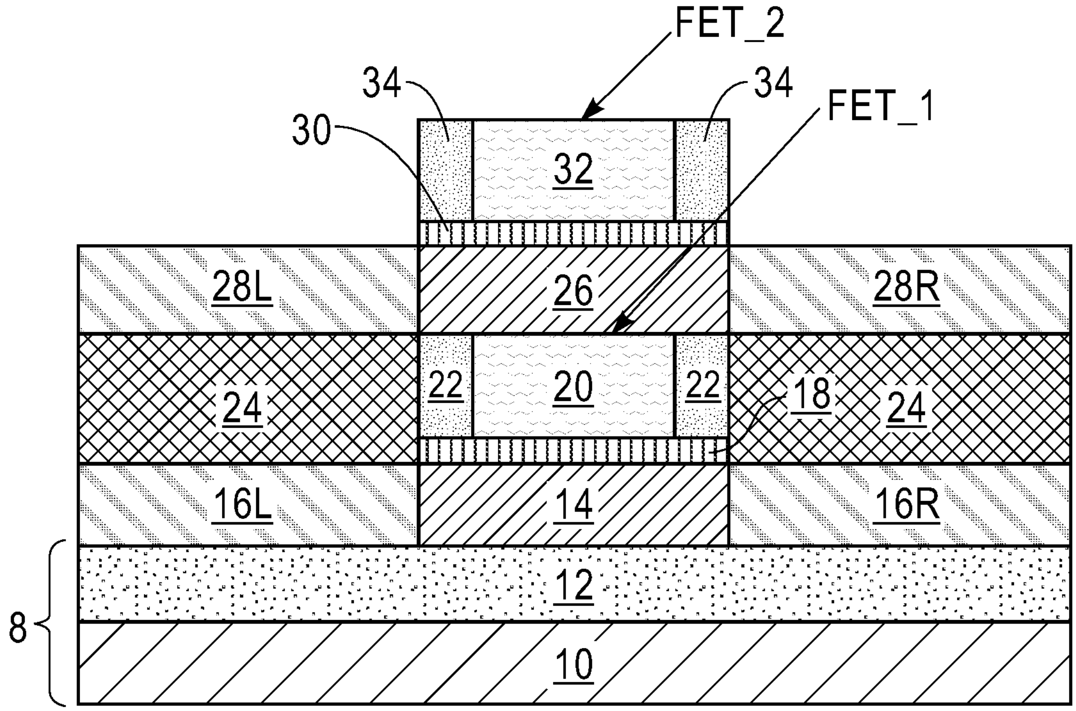
FIG. 1 is a cross sectional view of stacked first and second devices located in a diode region of a semiconductor substrate in accordance with an embodiment of the present application, wherein are least one of the first device and the second device is a lateral diode.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, a semiconductor structure including a first and second stacked devices (see, for example, FIG. 1) located in a diode region of a semiconductor substrate 8 is provided. The structure includes a first device having a first pair of doped regions 16L, 16R separated by a first semiconductor channel material region 14, and a second device located atop the first device and having a second pair of doped regions 28L, 28R separated by a second semiconductor channel material region 26. In the present application, the first pair of doped regions 16L, 16R are coplanar with each other and the second pair of doped regions 28L, 28R are coplanar with each other. In the present application, at least one of the first pair of doped regions 16L, 16R and the second pair of doped regions 28R. 28L includes an n-doped region and a p-doped region. In the present application, the p-doped region functions as an anode of a lateral diode, and the n-doped region functions as a cathode of the lateral diode.

The first semiconductor channel material region 14 and the second semiconductor channel material region 26 can be in the form of a layer, a fin, a nanosheet and/or a nanowire.

In some embodiments and as is illustrated in FIG. 1, the first device can further include a first gate structure of a first FET, i.e., FET_1, located on the first semiconductor channel material region 14. The first gate structure can include a first gate dielectric material layer 18 and a first gate electrode 20. A first gate spacer 22 can be located on a surface of the first gate dielectric material layer 18. The first gate spacer 22 can contact a sidewall of the first gate electrode 20.

In some embodiments and as is illustrated in FIG. 1, the second device can further include a second gate structure of a second FET, i.e., FET_2, located on the second semiconductor channel region 26. The second gate structure can include a second gate dielectric material layer 30 and a second gate electrode 32. A second gate spacer 34 can be located on a surface of the second gate dielectric material layer 30. The second gate spacer 34 can contact a sidewall of the second gate electrode 32. In some embodiments (for example, when the pair of second doped regions 28L, 28R are components of the lateral diode), the second gate structure and second gate spacer 34 can be omitted from the structure.

In embodiments of the present application, and as is illustrated in FIG. 1, a dielectric material layer 24 is located between the first pair of doped regions 16L, 16R and the second pair of doped regions 28L, 28R. The dielectric material layer 24 can contact a sidewall of the first gate spacer 22 and a sidewall of the first gate dielectric material layer 18. Dielectric material layer 24 electrically insulates the first device from the second device.

The various components/elements depicted in FIG. 1 will now be described in greater detail. In some embodiments, and as is illustrated in FIG. 1, the semiconductor substrate 8 includes an insulator layer 12 located on a base semiconductor material layer 10. In such embodiments, the insulator layer 12 contacts each of the pair of first doped regions 16L, 16R and the first semiconductor channel material region 14. In other embodiments (not specifically illustrated, but can be readily derived from FIG. 1), the semiconductor substrate 8 includes base semiconductor material layer 10. In such embodiments, the base semiconductor material layer 10 can contact each of the first pair of doped regions 16L, 16R and the first semiconductor channel material region 14.

The base semiconductor material layer 10 is composed of a first semiconductor material having semiconducting properties. Examples of first semiconductor materials that can be used to provide the base semiconductor material layer 10 include, but are not limited to, silicon (Si), a silicon germanium (SiGe) alloy, a silicon germanium carbide (SiGeC) alloy, germanium (Ge), III/V compound semiconductors or II/VI compound semiconductors. The base semiconductor material layer 10 can be composed of one or more of these first semiconductor materials. In one example, the first semiconductor material that provides the base semiconductor material layer 10 is composed of silicon. In some embodiments, the first semiconductor material layer that provides the base semiconductor material layer 10 can be undoped, i.e., an intrinsic, semiconductor material. In other embodiments, the first semiconductor material that provides the base semiconductor material layer 10 can be doped with an n-type dopant or p-type dopant.

The term "p-type dopant" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type dopant" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, first semiconductor material that provides the base semiconductor material layer 10 can typically have a dopant concentration of from 1e15 atoms/$cm^3$ to 1e16 atoms/$cm^3$.

The insulator layer 12 that can be optionally present includes any dielectric material such as, for example, silicon dioxide and/or boron nitride. When present, the insulator layer 12 can have a thickness from 1 nm to 25 nm; although other thicknesses for the insulator layer 12 are contemplated and can be employed in the present application.

The first semiconductor channel material region 14 is composed of a second semiconductor material. The second semiconductor material that provides the first semiconductor channel material region 14 can include one of the semiconductor materials mentioned above for the first semiconductor material that provides the base semiconductor material layer 10. In one example, the second semiconductor material that provides the first semiconductor channel material region 14 is composed of Si or Ge. In some embodiments, the second semiconductor material that provides the first semiconductor channel material region 14 is capable of providing high channel mobility for an nFET. In other embodiments, the second semiconductor material that provides the first semiconductor channel material region 14 is capable of providing high channel mobility for a pFET. The first semiconductor channel material region 14 can have a thickness from 20 nm to 50 nm; although other thicknesses for the first semiconductor channel material region 14 are contemplated and can be employed in the present application.

The first pair of doped regions 16L, 16R can be composed of a compositionally same or a compositionally different third semiconductor material including one of the semiconductor materials mentioned above for the base semiconductor material layer 10. In one example, the first pair of doped regions 16L, 16R are composed of Si. In another example, doped region 16L is composed of Si, while doped region 16R is composed of SiGe. Each of the doped regions that provide the first pair of doped regions 16L, 16R is typically, but not necessarily always, composed of a compositionally same semiconductor material as the first semiconductor material channel region 14.

In some embodiments, the first pair of doped regions 16L, 16R can be of a same first conductivity type. For example, the first conductivity type can be n-type, or p-type. In the case of being of an n-type conductivity, each of the first pair of doped regions 16L, 16R includes an n-type dopant, as defined above. In the case of being of a p-type conductivity, each of the first pair of doped regions 16L, 16R includes a p-type dopant, as defined above. For embodiments in which the first pair of doped regions 16L, 16R are of a same first conductivity type, the dopant (p-type or n-type) concentration of the first pair of doped regions 16L, 16R can be from 1e19 atoms/$cm^3$ to 1e21 atoms/$cm^3$. In embodiments in which the first pair of doped regions 16L, 16R are of a same first conductivity type, the pair of first doped regions 16L, 16R represent source/drain regions of a lower FET.

In some embodiments, the first pair of doped regions 16L, 16R can be of different conductivity types (i.e., one of doped regions of the first pair of doped regions is of a first conductivity type, while the other of the doped regions of the first pair of doped regions is of a second conductivity type that differs from the first conductivity type). In one example, the first conductivity type can be n-type (including an n-type dopant as defined above), and the second conductivity type can be p-type (including a p-type dopant, as defined above). In another example, the first conductivity type can be p-type (including a p-type dopant, as defined above), and the second conductivity type can be n-type (containing an n-type dopant, as defined above). For embodiments in which the first pair of doped regions 16L, 16R are of different conductivity types, the dopant (p-type an n-type) concentration in each of the doped regions that provide the first pair of doped regions 16L, 16R can be from 1e19 atoms/$cm^3$ to 1e21 atoms/$cm^3$. In embodiments, in which the first pair of doped regions 16L, 16R are of different conductivity types, the first doped region that is p-type represents an anode of a lateral diode, while the first doped region that is n-type represents a cathode of the lateral diode. In such an embodiment, current passes laterally through each of the cathode, the first semiconductor channel material region 14 and the anode.

The first gate dielectric material layer 18 is composed of a first gate dielectric material such as, for example, silicon dioxide, or a dielectric material having a dielectric constant greater than 4.0 (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide (Pb ($Sc,Ta)O_3$), and/or lead zinc niobite (Pb(Zn,Nb)O). The high-k gate dielectric material can further include dopants such as lanthanum (La), aluminum (Al) and/or magnesium (Mg). The first gate dielectric material layer 18 can include one or more of the above mentioned first gate dielectric materials. The first gate dielectric material layer 18 can have a thickness from 1 nm to 20 nm; although other thicknesses for the first gate dielectric material layer 18 are contemplated and can be employed in the present application.

The first gate electrode 20 is composed of a first gate electrode material. In some embodiments, the first gate electrode material is composed of an electrically conductive metal-containing material including, but not limited to, tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_X$), titanium carbide (TiC), titanium aluminum carbide, tungsten silicide ($WSi_2$), tungsten nitride (WN), ruthenium oxide ($RuO_2$), cobalt silicide, or nickel silicide.

In other embodiments, the first gate electrode material is composed of a first work function metal (WFM). The first WFM can be used to set a threshold voltage of FET_1 to a desired value. In some embodiments, the first WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the first WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

In some embodiments, the first gate electrode material that provides the first gate electrode 20 is a multilayered stack of an electrically conductive metal-containing material, and a first WFM.

The first gate electrode 20 can have a thickness from 10 nm to 100 nm; although other thicknesses for the first gate electrode 20 are contemplated and can be employed in the present application.

The first gate spacer 22 is composed of any dielectric spacer material including, but not limited to, silicon dioxide, silicon nitride, and/or silicon oxynitride. The first gate spacer 22 is present entirely along the sidewall of the first gate electrode 20.

The dielectric material layer 24 is composed of a dielectric material that can be compositionally the same as, or compositionally different from, the dielectric spacer material that provides the first gate spacer 22. In one example, the dielectric material layer 24 is composed of silicon dioxide, while the first gate spacer 22 is composed of silicon nitride. The dielectric material layer 24 can have a thickness from 20 nm to 50 nm; although other thicknesses for the dielectric material layer 24 are contemplated and can be employed in the present application. The dielectric material layer 24 typically has a topmost surface that is coplanar with at least a topmost surface of the first gate electrode 20. The dielectric material layer 24 is spaced apart from the sidewalls of the first gate electrode 20 by the first gate spacer 22.

The second semiconductor channel material region 26 is composed of a fourth semiconductor material. The fourth semiconductor material that provides the second semiconductor channel material region 26 can include one of the semiconductor materials mentioned above for the first semiconductor material that provides the base semiconductor material layer 10. In one example, the fourth semiconductor material that provides the second semiconductor channel material region 26 is composed of Si or Ge. In some embodiments, the fourth semiconductor material that provides the second semiconductor channel material region 26 can be compositionally the same as the second semiconductor material that provides the first semiconductor channel material region 14. In other embodiments, the fourth semiconductor material that provides the second semiconductor channel material region 26 can be compositionally different from the second semiconductor material that provides the first semiconductor channel material region 14.

In some embodiments, the fifth semiconductor material that provides the second semiconductor channel material region 26 is capable of providing high channel mobility for an nFET. In other embodiments, the fifth semiconductor material that provides second semiconductor channel material region 26 is capable of providing high channel mobility for a pFET. The second semiconductor channel material region 26 can have a thickness from 20 nm to 50 nm; although other thicknesses for the second semiconductor channel material region 26 are contemplated and can be employed in the present application.

The second pair of doped regions 28L, 28R can be composed of a compositionally same or a compositionally different sixth semiconductor material including one of the semiconductor materials mentioned above for the base semiconductor substrate 10. In one example, the second pair of doped regions 28L, 28R are composed of Si. In another example, doped region 28L is composed of Si, while doped region 28R is composed of SiGe. Each of the doped regions that provide the second pair of doped regions 28L, 28R is typically, but not necessarily always, composed of a compositionally same semiconductor material as the second semiconductor material channel region 26.

In some embodiments, the second pair of doped regions 28L, 28R can be of a same first conductivity type. For example, the first conductivity type can be n-type, or p-type. In the case of being of an n-type conductivity, each of the second pair of doped regions 28L, 28R includes an n-type dopant, as defined above. In the case of being of a p-type conductivity, each of the second pair of doped regions 28L, 28R includes a p-type dopant, as defined above. For embodiments in which the second pair of doped regions 28L, 28R are of a same first conductivity type, the dopant (p-type or n-type) concentration of the second pair of doped regions 28L, 28R can be from 1e19 atoms/$cm^3$ to 1e21 atoms/$cm^3$. In embodiments, in which the second pair of doped regions 28L, 28R are of a same first conductivity type, the pair of second pair of doped regions 28L, 28R represent source/drain regions of an upper FET.

In some embodiments, the second pair of doped regions 28L, 28R can be of different conductivity types (i.e., one of the doped regions of the second pair of doped regions is of a first conductivity type, while the another of the doped regions of the second pair of doped regions is of a second conductivity type that differs from the first conductivity type). In one example, the first conductivity type can be n-type (including an n-type dopant as defined above), and the second conductivity type can be p-type (including a p-type dopant, as defined above). In another example, the first conductivity type can be p-type (including a p-type dopant, as defined above), and the second conductivity type can be n-type (containing an n-type dopant, as defined above). For embodiments in which the second pair of doped regions 28L, 28R are of different conductivity types, the dopant (p-type an n-type) concentration in each of the doped regions that provide the second pair of doped regions 28L, 28R can be from 1e19 atoms/$cm^3$ to 1e21 atoms/$cm^3$. In embodiments, in which the second pair of doped regions 28L, 28R are of different conductivity types, the second doped region that is p-type represents an anode of a lateral diode, while the second doped region that is n-type represents a cathode of the lateral diode. In such an embodiment, current passes laterally through each of the cathode, the second semiconductor channel material region 26 and the anode.

The second gate dielectric material layer 30 is composed of a second gate dielectric material. The second gate dielectric material includes at least one of the first gate dielectric materials mentioned above. The second gate dielectric material that provides the second gate dielectric material layer 30 can be compositionally the same as, or compositionally different from, the first gate dielectric material that provide the first gate dielectric material layer 18. The second gate dielectric material layer 30 can have a thickness from 1 nm to 20 nm; although other thicknesses for the second gate dielectric material layer 30 are contemplated and can be employed in the present application.

The second gate electrode 32 is composed of a second gate electrode material. In some embodiments, the second gate electrode material that provides the second gate electrode 32 is composed of one of the electrically conductive metal-containing materials mentioned above for the first gate electrode 20. In other embodiments, the second gate electrode material is composed of a second work function metal (WFM). The second WFM is compositionally different from the first WFM. The second WFM can be used to set a threshold voltage of FET_2 to a desired value. In some embodiments, the second WFM can be selected to effectuate an n-type threshold voltage shift, as defined above. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the second WFM can be selected to effectuate a p-type threshold voltage shift, as defined above. Examples of such materials that can effectuate a p-type threshold voltage shift include, but are not limited to, titanium nitride, and tantalum carbide, hafnium carbide, and combinations thereof. In yet other embodiments, the second gate electrode material that provides the second gate electrode 32 is composed of both an electrically conductive metal-containing material and a second WFM. The second gate electrode 32 can have a thickness from 10 nm to 100 nm; although other thicknesses for the second gate electrode 32 are contemplated and can be employed in the present application.

The second gate spacer 34 is composed of any dielectric spacer material including, but not limited to, silicon dioxide, silicon nitride, and/or silicon oxynitride. The second gate spacer 34 is present entirely along the sidewall of the second gate electrode 32.

In some embodiments of the present application, the first pair of doped regions 16L, 16R of the first device are the n-doped region and the p-doped region of the lateral diode, and the second pair of doped regions 28L, 28R of the second device are source/drain regions of a transistor. In such embodiment, the transistor can be a functional FET or a non-functional FET; in this embodiment the FET can be referred to as a second FET, FET_2. Non-functional FETs typically are left unconnected in the present application. FET_2 can be an nFET or a pFET.

In other embodiments of the present application, the second pair of doped regions 28L, 28R of the second device are the n-doped region and the p-doped region of the lateral diode and the first pair of doped regions 16L, 16R of the first device are source/drain regions of a transistor. In such embodiment, the transistor can be a functional FET or a non-functional FET in this embodiment the FET can be referred to as a first FET, FET_1. Again, non-functional FETs typically are left unconnected in the present application. FET_1 can be an nFET or a pFET.

In yet other embodiments of the present application, the first pair of doped regions 16L. 16R as the n-doped region and the p-doped region of a first lateral diode and the second pair of doped regions 28L, 28R of the second device are the n-doped region and the p-doped region of a second lateral diode. In this embodiment, each of the n-doped regions are located on a first side of the first device and the second device, and each of the p-doped regions are located on a second side of the first device and the second device wherein the second side is opposite the first side. In this embodiment, a parallel pair of first and second lateral diodes can be provided. Also, and in this embodiment, the second gate structure (i.e., the second gate dielectric material layer 30 and the second gate electrode 32) and the second gate spacer 34 can be present in the structure, or the second gate structure (i.e., the second gate dielectric material layer 30 and the second gate electrode 32) and the second gate spacer 34 can be omitted from the structure.

It is noted that the width of the first semiconductor channel material region 16 can be the same as, or different from, the width of the second semiconductor channel material region 26.

Figure 2:
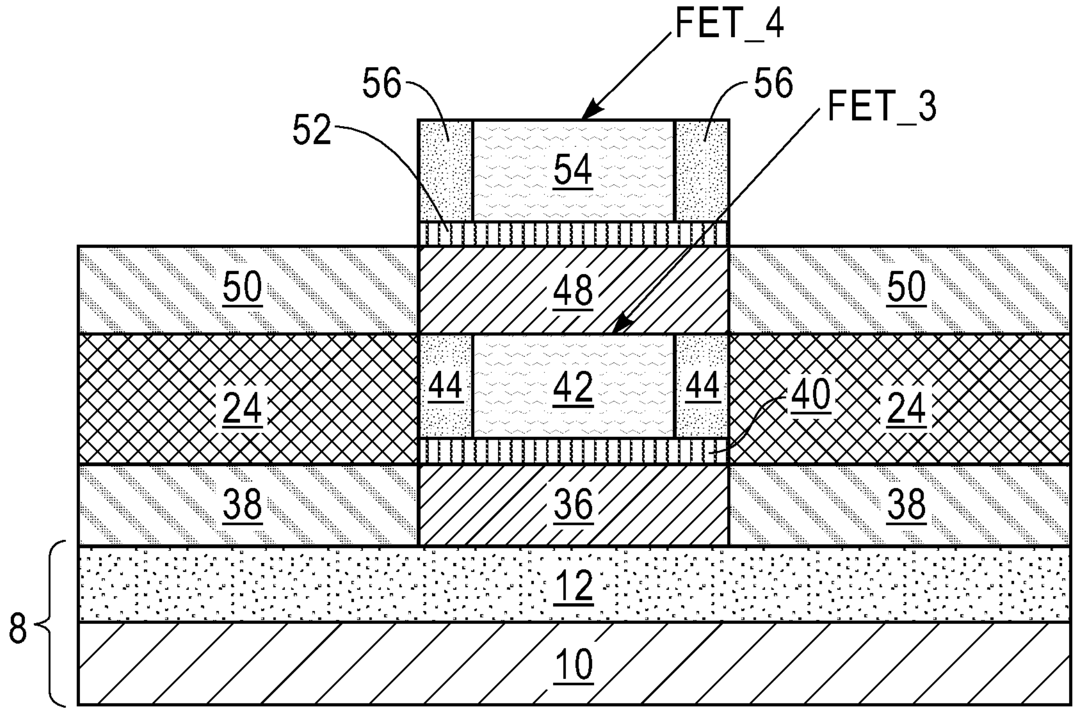
FIG. 2 is a cross sectional view of a stacked FET in a stacked FET device region of the semiconductor structure; the stacked FET can be located adjacent to the stacked first and second devices shown in FIG. 1.

In some embodiments of the present application and as is illustrated in FIG. 2, the semiconductor structure can further include a stacked FET located in a stacked FET device region of the semiconductor substrate 8. In the present application, the stacked FET device region is located adjacent to the diode region of the semiconductor structure 8. That is, the stacked FET shown in FIG. 2 is located adjacent to the stacked first and second devices illustrated in FIG. 1; the stacked FET and the stacked first and second devices are located on the same substrate, i.e., semiconductor substrate 8. The stacked FET illustrated in FIG. 2 includes a lower FET, hereinafter FET_3, having third conductivity type source/drain regions 38, and an upper FET, hereinafter FET_4, located above FET_3 and having fourth conductivity type source/drain regions 50. In the stacked FET device region, dielectric material layer 24 is also present and the dielectric material layer 24 present in the stacked FET device region electrically insulates the third conductivity type source/drain regions 38 of FET_3 from the fourth conductivity type source/drain regions 50 of FET_4. In embodiments, the stacked FET illustrated in FIG. 2 is located at a same device level as the stacked first and second devices illustrated in FIG. 1

In some embodiments, the third conductivity type source/drain regions 38 are of the same conductivity type as the fourth conductivity type source/drain regions 50, i.e., both are n-type or both are p-type. In such an embodiment, FET_3 and FET_4 are of the same conductivity. In other embodiments, the third conductivity type source/drain regions 38 are a different conductivity type than the fourth conductivity type source/drain regions 50.

FET_3 of the stacked FET illustrated in FIG. 2 includes a third semiconductor channel material region 36 located laterally between each of the third conductivity type source/drain regions 38, and FET_4 of the stacked FET illustrated in FIG. 2 includes a fourth semiconductor channel material region 48 located laterally between each of the fourth conductivity type source/drain regions 50.

As is further illustrated in FIG. 2, FET_3 includes a third gate dielectric material layer 40 located on the third semiconductor channel material layer 38 and a third gate electrode 42 located on the third gate dielectric material layer 40, while FET_4 includes a fourth gate dielectric material layer 52 located on the fourth semiconductor channel material region 48 and a fourth gate electrode 54 located on the fourth gate dielectric material layer 52.

As is further illustrated in FIG. 2, a third gate spacer 44 is located on the third gate dielectric material layer 40 and contacts a sidewall of the third gate electrode 42, and a fourth gate spacer 56 is located on the fourth gate dielectric material layer 52 and contacts a sidewall of the fourth gate electrode 54. As is even further illustrated in FIG. 2, the third gate spacer 44 further contacts the dielectric material layer 46 that vertically separates the third conductivity type source/drain regions 38 from the fourth conductivity type source/drain regions 50.

The various components/elements depicted in FIG. 2 will now be described in greater detail. Semiconductor substrate 8 can include the base semiconductor material layer 10 and, optionally the insulator layer 12, as defined above.

The third semiconductor channel material region 36 is composed of a seventh semiconductor material. The seventh semiconductor material that provides the third semiconductor channel material region 36 can include one of the semiconductor materials mentioned above for the first semiconductor material that provides the base semiconductor material layer 10. In some embodiments, the seventh semiconductor material layer that provides the third semiconductor channel material region 36 is compositionally the same as the second semiconductor material layer that provides the first semiconductor channel material region 14. In other embodiments, the seventh semiconductor material layer that provides the third semiconductor channel material region 36 is compositionally different than the second semiconductor material layer that provides the first semiconductor channel material region 14. In some embodiments, the seventh semiconductor material that provides the third semiconductor channel material region 36 is capable of providing high channel mobility for an nFET. In other embodiments, the seventh semiconductor material that provides the third semiconductor channel material region 36 is capable of providing high channel mobility for a pFET. The third semiconductor channel material region 36 can have a thickness in the thickness range mentioned above for the first semiconductor channel material region 14.

The third conductivity-type source/drain regions 38 are composed of an eighth semiconductor material that can be compositionally the same as, or compositionally different from, the seventh semiconductor material that provides the third semiconductor channel material region 36. Typically, the eighth semiconductor material that provides the third conductivity-type source/drain regions 38 and the seventh semiconductor material that provides the third semiconductor channel material region 36 are compositionally the same. The eighth semiconductor material layer that provides the third conductivity-type source/drain regions 38 can be compositionally the same as, or compositionally different from, the third semiconductor material that provides the first pair of doped regions 16L, 16R.

The eighth semiconductor material that provides the third conductivity-type source/drain regions 38 are doped with either a p-type dopant, as defined above, or an n-type dopant as defined above. The dopant concentration in the eighth semiconductor material that provides the third conductivity-type source/drain regions 38 is within the dopant range mentioned above, i.e., from 1e19 atoms/$cm^3$ to 1e21 atoms/$cm^3$. The thickness of the third conductivity-type source/drain regions 38 is typically within the range of the thickness of the third semiconductor channel material region 36. The third conductivity-type source/drain regions 38 typically, but not necessarily always, have a same thickness as the third semiconductor channel material region 36 such that a topmost surface of each of the third conductivity-type source/drain regions 38 is coplanar with a topmost surface of the third semiconductor channel material region 36.

The third gate dielectric material layer 40 is composed of a third gate dielectric material. The third gate dielectric material includes one of the first gate dielectric materials mentioned above for the first gate dielectric material layer 18. The third gate dielectric material that provides the third gate dielectric material layer 40 can be compositionally the same as, or compositionally different from, the first gate dielectric material that provides the first gate dielectric material layer 18. The third gate dielectric material layer 40 can have a thickness within the thickness range mentioned above for the first gate dielectric material layer 18.

The third gate electrode 42 is composed of a third gate electrode material. The third gate electrode material includes one of the first gate electrode materials, i.e., electrically conductive metal-containing materials and/or WFMs, mentioned above for first gate electrode material that provides the first gate electrode 20. The third gate electrode material that provides the third gate electrode 42 can be compositionally the same as, or compositionally different from, the first gate electrode material that provides the first gate electrode 20. The third gate electrode 42 can have a thickness within the thickness range mentioned above for the first gate electrode 20.

The third gate spacer 44 is composed of any dielectric spacer material including, but not limited to, silicon dioxide, silicon nitride, and/or silicon oxynitride. The third gate spacer 44 is present entirely along the sidewall of the third gate electrode 42.

In the stacked FET device region illustrated in FIG. 2, the dielectric material layer 26 typically has a topmost surface that is coplanar with at least a topmost surface of the third gate electrode 42. The dielectric material layer 46 is spaced apart from the sidewalls of the third gate electrode 42 by the third gate spacer 44.

The fourth semiconductor channel material region 48 is composed of a ninth semiconductor material. The ninth semiconductor material that provides the fourth semiconductor channel material region 48 can include one of the semiconductor materials mentioned above for the first semiconductor material that provides the base semiconductor material layer 10. In some embodiments, the ninth semiconductor material that provides the fourth semiconductor channel material region 48 can be compositionally the same as the seventh semiconductor material that provides third semiconductor channel material region 36. In other embodiments, the ninth semiconductor material that provides the fourth semiconductor channel material region 48 can be compositionally different from the seventh semiconductor material that provides the third semiconductor channel material region 36. In some embodiments, the ninth semiconductor material that provides the fourth semiconductor channel material region 48 can be compositionally the same as, or compositionally different from the fourth semiconductor material that provides second semiconductor channel material region 26. In some embodiments, the ninth semiconductor material that provides the fourth semiconductor channel material region 48 is capable of providing high channel mobility for an nFET. In other embodiments, the ninth semiconductor material that provides fourth semiconductor channel material region 48 is capable of providing high channel mobility for a pFET. The fourth semiconductor channel material region 48 can have a thickness from 20 nm to 50 nm; although other thicknesses for the fourth semiconductor channel material region 48 are contemplated and can be employed in the present application.

The fourth conductivity-type source/drain regions 50 are composed of a tenth semiconductor material that can be compositionally the same as, or compositionally different from, the ninth semiconductor material that provides the fourth semiconductor channel material region 48. The tenth semiconductor material that provides the fourth conductivity-type source/drain regions 50 are doped with either a p-type dopant, as defined above, or an n-type dopant as defined above. The conductivity type of the dopant that is present in the fourth conductivity-type source/drain regions 50 can be the same as, or opposite from, from the conductivity type of dopant that is present in the third conductivity type source/drain regions 36. The fourth conductivity-type source/drain regions 50 can have a dopant (p-type or n-type) concentration of from 1e19 atoms/$cm^3$ to 1e21 atoms/$cm^3$. The fourth conductivity-type source/drain regions 50 have a thickness that is typically within the range of the thickness of the fourth semiconductor channel material region 48. The fourth conductivity-type source/drain regions 50 typically, but not necessarily always, have a same thickness as the fourth semiconductor channel material region 48 such that a topmost surface of each of the fourth conductivity-type source/drain regions 50 is coplanar with a topmost surface of the fourth semiconductor channel material layer 40.

The fourth gate dielectric material layer 52 is composed of a fourth gate dielectric material. The fourth gate dielectric material includes at least one of the first gate dielectric materials mentioned above. The fourth gate dielectric material layer that provides the fourth gate dielectric material layer 52 can be compositionally the same as, or compositionally different from, the third and/or second gate dielectric materials mentioned above. The fourth gate dielectric material layer 52 can have a thickness from 1 nm to 20 nm; although other thicknesses for the fourth gate dielectric material layer 52 are contemplated and can be employed in the present application.

The fourth gate electrode 54 is composed of a fourth gate electrode material. The fourth gate electrode material that provides the fourth gate electrode 54 includes one of the first gate electrode materials, i.e., electrically conductive metal-containing materials and/or WFMs, mentioned above for first gate electrode material that provides the first gate electrode 20. The fourth gate electrode material that provides the fourth gate electrode 54 can be compositionally the same as, or compositionally different from, the third gate electrode material that provides the provides the third gate electrode 20 and/or the second gate electrode material that provides the second gate electrode 32. The fourth gate electrode 54 can have a thickness within the thickness range mentioned above for the first gate electrode 20.

The fourth gate spacer 56 is composed of any dielectric spacer material including, but not limited to, silicon dioxide, silicon nitride, and/or silicon oxynitride. The fourth gate spacer 56 is present entirely along the sidewall of the fourth gate electrode 42.

It is noted that the channel width of FET_3 and FET_4 can be the same as is illustrated in FIG. 2, or the channel width of FET_3 can be different from the channel width of FET_4. In some embodiments, FET_3 and FET_4 are both nFETs. In other embodiments, FET_3 and FET_4 are both pFETs. In yet other embodiments, FET_3 is an nFET, and FET_4 is a pFET. In yet further embodiments, FET_3 is a pFET, and FET_4 is an nFET.

Although the present application describes and illustrates planar FETs for FET_1, FET_2. FET_3 and FET_4, the present application contemplates embodiments in which at least one of FET_1, FET_2, FET_3 and FET_4 is a non-planar device such as, for example, a semiconductor fin-containing FET, a nanowire-containing FET, and/or a nanosheet-containing FET.

The stacked first and second devices and the stacked FET shown in FIGS. 1 and 2, respectively, can be formed utilizing any conventional stacked FET device process. Notably, the stacked first and second device and the stacked FET shown in FIGS. 1 and 2, respectively, can be formed utilizing various deposition steps including, for example, chemical vapor deposition (CVD), plasma enhanced chemical vapor deposition (PECVD), physical vapor deposition (PVD), atomic layer deposition (ALD), evaporation and/or sputtering. In addition to using various deposition processes, the stacked first and second devices and the stacked FET shown in FIGS. 1 and 2, respectively, can also include various patterning steps. Patterning can include lithography and etching. For the various doped semiconductor materials that are present in the stacked FET vertical diode and the stacked FET shown in FIGS. 1 and 2, respectively, the doped semiconductor material layers can be formed by first depositing a semiconductor material, and then introducing a dopant into the deposited semiconductor material by ion implantation or gas phase doping. The deposition of the semiconductor material can include, for example, CVD, PECVD or epitaxial growth process in which the dopant is introduced after the epitaxial growth process. In other embodiment, the doped semiconductor material layers can be formed by an epitaxial growth process in which the dopant is present as one of the reactant precursors.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a first device comprising a first pair of doped regions separated by a first semiconductor channel material region, and a second device located above the first device and comprising a second pair of doped regions separated by a second semiconductor channel material region, wherein the first pair of doped regions are coplanar with each other and the second pair of doped regions are coplanar with each other, and at least one of the first pair of doped regions and the second pair of doped regions comprises an n-doped region and a p-doped region, and wherein the p-doped region functions as an anode of a lateral diode, and the n-doped region functions as a cathode of the lateral diode;

a dielectric material layer vertically separating, and electrically insulating, the first pair of doped regions from the second pair of doped regions; and a gate structure comprising a gate dielectric layer and a gate electrode located between the first semiconductor channel material region and the second semiconductor channel material region and laterally adjacent to the dielectric material layer, wherein gate dielectric layer contacts the first semiconductor channel material region and the gate electrode contacts the second semiconductor channel material region.

2. The semiconductor structure of claim 1, wherein the first pair of doped regions comprises the n-doped region and the p-doped region, and the second pair of doped regions are source/drain regions that comprise a same conductivity type dopant.

3. The semiconductor structure of claim 2, wherein the same conductivity type dopant is an n-type dopant.

4. The semiconductor structure of claim 2, wherein the same conductivity type dopant is a p-type dopant.

5. The semiconductor structure of claim 2, wherein the second device is a functional FET.

6. The semiconductor structure of claim 2, wherein the second device is a non-functional FET.

7. The semiconductor structure of claim 1, wherein both the first pair of doped regions and the second pair of doped region comprise the n-doped region and the p-doped region, and each of the n-doped regions are located on a first side of the first device and the second device, and each of the p-doped regions are located on a second side of the first device and the second device wherein the second side is opposite the first side.

8. A semiconductor structure comprising:

a first device comprising a first pair of doped regions separated by a first semiconductor channel material region, and a second device located above the first device and comprising a second pair of doped regions separated by a second semiconductor channel material region, wherein the first pair of doped regions are coplanar with each other and the second pair of doped regions are coplanar with each other, and at least one of the first pair of doped regions and the second pair of doped regions comprises an n-doped region and a p-doped region, and wherein the p-doped region functions as an anode of a lateral diode, and the n-doped region functions as a cathode of the lateral diode, wherein the second pair of doped regions comprises the n-doped region and the p-doped region, and the first pair of doped regions are source/drain regions that comprise a same conductivity type dopant.

9. The semiconductor structure of claim 8, wherein the same conductivity type dopant is an n-type dopant.

10. The semiconductor structure of claim 8, wherein the same conductivity type dopant is a p-type dopant.

11. The semiconductor structure of claim 8, wherein the first device is a functional FET.

12. The semiconductor structure of claim 8, wherein the first device is a non-functional FET.

13. The semiconductor structure of claim 8, further comprises a dielectric material layer located between the first pair of doped regions and the second pair of doped regions.

14. A semiconductor structure comprising:

a first device comprising a first pair of doped regions separated by a first semiconductor channel material region, and a second device located above the first device and comprising a second pair of doped regions separated by a second semiconductor channel material region, wherein the first pair of doped regions are coplanar with each other and the second pair of doped regions are coplanar with each other, and at least one of the first pair of doped regions and the second pair of doped regions comprises an n-doped region and a p-doped region, and wherein the p-doped region functions as an anode of a lateral diode, and the n-doped region functions as a cathode of the lateral diode, wherein the first device and the second device are located in a diode region of a semiconductor substrate.

15. The semiconductor structure of claim 14, wherein the semiconductor substrate comprises an insulator layer located on a base semiconductor material layer, wherein the insulator layer contacts the first pair of doped regions.

16. The semiconductor structure of claim 14, wherein the semiconductor substrate comprises a base semiconductor material layer, wherein the base semiconductor material layer contacts the first pair of doped regions.

17. The semiconductor structure of claim 14, further comprising a stacked FET located in a stacked FET device region of the semiconductor substrate, wherein the stacked FET device region is located adjacent to the diode region of the semiconductor substrate.

18. The semiconductor structure of claim 17, wherein the stacked FET device comprises an upper FET stacked above a lower FET.

19. The semiconductor structure of claim 18, wherein the lower FET is of a same conductivity type as the upper FET.

20. The semiconductor structure of claim 18, wherein the lower FET is of a different conductivity type than the upper FET.

* * * * *